United States Patent
Chen et al.

(10) Patent No.: US 8,050,054 B2
(45) Date of Patent: Nov. 1, 2011

(54) ELECTRONIC DEVICE WITH A BASE PLATE

(75) Inventors: Makan Chen, Fislisbach (CH); Daniel Schneider, Otelfingen (CH); Raymond Zehringer, Muttenz (CH)

(73) Assignee: ABB Technology AG, Zurich (DE)

( * ) Notice: Subject to any disclaimer, the term of this patent is extended or adjusted under 35 U.S.C. 154(b) by 264 days.

(21) Appl. No.: 12/003,041

(22) Filed: Dec. 19, 2007

(65) Prior Publication Data
US 2008/0291640 A1 Nov. 27, 2008

(30) Foreign Application Priority Data
Dec. 22, 2006 (EP) .................................. 06026658

(51) Int. Cl.
H05K 1/11 (2006.01)

(52) U.S. Cl. ........ 361/804; 361/600; 361/699; 361/701; 361/702; 361/703; 361/704; 174/252; 174/548; 257/675; 257/691; 257/707; 257/712; 257/783

(58) Field of Classification Search .................. 361/804, 361/600, 701–704, 699; 174/252, 548; 257/675, 257/691, 707, 712, 783
See application file for complete search history.

(56) References Cited

U.S. PATENT DOCUMENTS

| | | | |
|---|---|---|---|
| 4,632,294 A * | 12/1986 | Druschel et al. | 228/119 |
| 4,759,491 A * | 7/1988 | Fisher | 228/180.21 |
| 5,200,365 A * | 4/1993 | Culver | 156/60 |
| 5,201,451 A * | 4/1993 | Desai et al. | 228/5.5 |
| 5,316,069 A * | 5/1994 | Aghajanian et al. | 164/97 |
| 5,361,824 A * | 11/1994 | Keck et al. | 164/98 |
| 5,505,248 A * | 4/1996 | Aghajanian et al. | 164/97 |
| 5,666,269 A * | 9/1997 | Romero et al. | 361/699 |
| 5,773,898 A * | 6/1998 | Kobayashi | 257/783 |
| 5,784,256 A | 7/1998 | Nakamura et al. | |
| 5,978,216 A * | 11/1999 | Choi | 361/690 |
| 6,122,170 A * | 9/2000 | Hirose et al. | 361/704 |
| 6,436,550 B2 * | 8/2002 | Sakata et al. | 428/553 |
| 6,462,410 B1 * | 10/2002 | Novotny et al. | 257/707 |
| 6,622,786 B1 * | 9/2003 | Calmidi et al. | 165/185 |
| 6,723,279 B1 * | 4/2004 | Withers et al. | 419/27 |

(Continued)

FOREIGN PATENT DOCUMENTS
WO WO 2004/065050 A2 8/2004

OTHER PUBLICATIONS

Hayashi K. et al: "Improvement of fatigue life of solder joints by thickness control of solder with wire bump technique" 2002 Proceedings 52nd, Electronic Components and Technology Conference. ECTC 2002. San Diego, CA, May 28-31, 2002, Proceedings of the Eletronic Components and Technology Conference, New York, NY: IEEE, US, vol. Conf. 52, May 28, 2002, pp. 1469-1474, XP010747830 ISBN: 0-7803-7430-4.

(Continued)

*Primary Examiner* — Xiaoliang Chen
(74) *Attorney, Agent, or Firm* — Buchanan Ingersoll & Rooney PC

(57) ABSTRACT

A base plate for a heat sink comprises a cooling plate and spacer elements, which are arranged on the surface of the cooling plate. The spacer elements and the cooling plate are made as one piece and the material in the surface region of the cooling plate and of the spacer elements being the same and formed in the same process.

22 Claims, 2 Drawing Sheets

U.S. PATENT DOCUMENTS

| | | | |
|---|---|---|---|
| 6,753,507 B2* | 6/2004 | Fure et al. | 219/444.1 |
| 6,762,491 B1* | 7/2004 | Hatae et al. | 257/712 |
| 6,807,059 B1* | 10/2004 | Dale | 361/703 |
| 6,817,405 B2* | 11/2004 | Kamath et al. | 165/80.3 |
| 6,874,910 B2* | 4/2005 | Sugimoto et al. | 362/294 |
| 6,903,271 B2* | 6/2005 | Pearson et al. | 174/548 |
| 6,919,504 B2* | 7/2005 | McCutcheon et al. | 174/16.3 |
| 7,582,959 B2* | 9/2009 | Fukusako | 257/678 |
| 7,649,739 B2* | 1/2010 | Murai et al. | 361/701 |
| 2002/0138973 A1* | 10/2002 | Ishikawa et al. | 29/739 |
| 2003/0015517 A1* | 1/2003 | Fure et al. | 219/444.1 |
| 2003/0038362 A1* | 2/2003 | Nomura | 257/706 |
| 2003/0102553 A1* | 6/2003 | Ishikawa et al. | 257/707 |
| 2003/0189830 A1* | 10/2003 | Sugimoto et al. | 362/294 |
| 2004/0007772 A1* | 1/2004 | Arai et al. | 257/691 |
| 2004/0017005 A1* | 1/2004 | Kobayashi et al. | 257/707 |
| 2004/0061206 A1* | 4/2004 | Son et al. | 257/675 |
| 2004/0144561 A1* | 7/2004 | Osanai et al. | 174/252 |
| 2004/0159940 A1* | 8/2004 | Hiyoshi | 257/732 |
| 2006/0272801 A1* | 12/2006 | Ikawa | 165/149 |
| 2007/0121299 A1* | 5/2007 | Campbell et al. | 361/710 |
| 2007/0258194 A1* | 11/2007 | Okayama et al. | 361/600 |
| 2009/0200065 A1* | 8/2009 | Otoshi et al. | 174/252 |

OTHER PUBLICATIONS

Kevin A Moores et al: "Thermal Characterization of a Liquid Cooled AlSiC Base Plate with Integral Pin Fins" IEEE Transactions on Components and Packaging Technologies, IEEE Service Center, Piscataway, NJ, US vol. 24, No. 2, Jun. 2001, XP011011233 ISSN: 1521-3331 pp. 213-214: figures 1,2.

European Search Report.

* cited by examiner

ELECTRONIC DEVICE WITH A BASE PLATE

RELATED APPLICATION

This application claims priority under 35 U.S.C. §119 to European Patent Application No. 06026658.2 filed in the European Patent Office on 22 Dec. 2006, the entire contents of which are hereby incorporated by reference in their entireties.

TECHNICAL FIELD

An electronic device with a base plate for a heat sink is disclosed.

BACKGROUND INFORMATION

WO 2004/065050 describes a method to solder a capacitor to a printed circuit board (PCB). In order to achieve a defined thickness of the solder layer between the capacitor and the PCB, the solder paste contains a solder material and a spacer material, which has a melting point higher than the melting point of the solder material. Typically, the spacer material is in form of spheres. During heating of the solder paste, the solder paste is heated to a temperature that is higher than the melting point of the solder material, but lower than the melting point of the spacer material. The spacer material stays as a solid in the paste, so that the capacitor and the PCB are spaced at a predetermined thickness from each other after the heating process. The distance between the capacitor and PCB can be varied by varying the dimensions of the spacer material in the solder paste.

U.S. Pat. No. 5,784,256 refers to a notebook with a printed circuit board (PCB) including a heat generating IC chip. The chip on the PCB is cooled by clamp contacting the PCB between a cover and a cooling plate having four bosses with holes for inserting screws. The cover and cooling plate with the PCB in between are clamped together by inserting screws from the cover to the holes in the cooling plate. Between the chip and the cooling plate, which is made of a metal with high electrical and thermal conductivity, an electrically and thermally conductive layer is arranged.

SUMMARY

An electronic device with a base plate for a heat sink is disclosed, which allows metallurgical bonding of the base plate to a power electronic component without the danger of tilting of the base plate against the power electronic component and which base plate is easy to manufacture.

An electronic device is disclosed comprising at least one power electronic component, in particular at least one semiconductor chip, an electrically insulating plate and a base plate with a cooling plate, wherein the base plate comprises spacer elements, which are arranged on the surface of the cooling plate, the spacer elements and the cooling plate being made as one piece and the material in the surface region of the cooling plate and of the spacer elements being the same, in that the at least one power electronic component is bonded by a metallurgical process, in particular by soldering, metal or low-temperature bonding, on the electrically insulating plate, in particular on a ceramic substrate, which electrically insulating plate is bonded by a metallurgical process, in particular by soldering or low-temperature bonding, on the base plate.

BRIEF DESCRIPTION OF DRAWINGS

The subject matter of the disclosure will be explained in more detail in the following text with reference to the attached drawings, in which.

The reference symbols used in the figures and their meaning are summarized in the list of reference symbols. Generally, alike or alike-functioning parts are given the same reference symbols. The described embodiments are meant as examples and shall not confine the disclosure.

DETAILED DESCRIPTION

An exemplary electronic device comprises a base plate with a cooling plate and spacer elements, which are arranged on the surface of the cooling plate. The spacer elements and the cooling plates are made as one piece with the material at least in the surface region of the cooling plate and the spacer elements being the same.

The base plate of the exemplary electronic device allows to achieve a predetermined distance to a power electronic component, which is metallurgical bonded to the base plate. A tilting of the power electronic component against the base plate is minimised by the introduction of spacer elements on the cooling plate, which tilting would lead to different thermal extension of the areas of the bonding layer with different bonding layer, e.g. solder layer thicknesses. In that case heat distribution would be worse in the areas of greater solder thickness, because the solder material has typically a worse heat conductivity than the base plate itself or the electronic element. Additionally, there would be a danger of a delamination of the power electronic component from the base plate in case of extended thermal cycling.

With the exemplary electronic device with a base plate, any solder material, suitable for achieving the desired connection between the base plate and the power electronic component in terms of temperature during the soldering and thermal properties of the solder layer can be used.

Furthermore, with such an exemplary electronic device with a base plate heat can be distributed in a uniform way between the heat producing parts of a power electronic component and the base plate, if the spacer elements are arranged in areas of the base plate, which are not directly below the heat producing part of the power electronic component.

Figure 1:
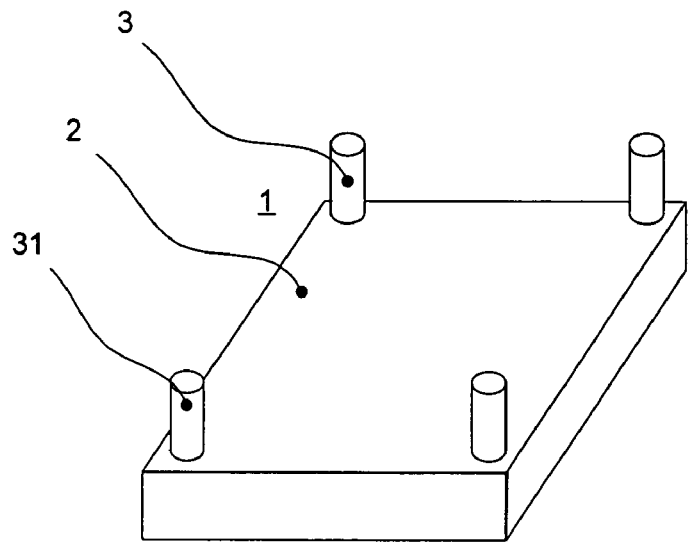
FIG. 1 shows a perspective view on a first exemplary embodiment of the base plate for a heat sink according to the disclosure.

In FIG. 1 a base plate 1 for a heat sink according to the disclosure is shown. The base plate 1 comprises a cooling plate 2 and spacer elements 3, which are arranged on the surface of the cooling plate 2. The spacer elements 3 and the cooling plate 2 are made as one piece and the material at least in the surface region of the cooling plate 2 and of the spacer elements is the same. Of course, the cooling plate can also be completely made of said material.

Typically the cooling plate 2 is made of a metal matrix composite, e.g. a Silicon-Carbide (SiC) preform infiltrated with molten Aluminum. For the manufacturing of such a metal matrix composite the SiC preform is placed in a mold, which has the negative form of the desired final base plate 1 and then the preform is infiltrated with the Aluminum. For an exemplary base plate the mold comprises recesses, by which in the final base plate 1 spacer elements 3 are formed.

The spacer elements 3, as shown in FIG. 1, are made in the form of small pins 31. In an exemplary embodiment the pins 31 have a diameter of less than 2 mm×2 mm, in particular 1 mm×1 mm in order to have only a small influence to heat distribution and homogeneous thermal expansion coefficient of the solder layer.

The spacer elements 3 and the cooling plate 2 are made as one piece and the material in the surface region of the cooling plate 2 and of the spacer elements 3 is the same. For a metal matrix composite that means that the pins 31 can be made of Aluminum in the same step as the infiltration with Aluminum.

In another exemplary embodiment the pins 31 extend the surface of the cooling plate 2 to a height 32 between 50 to 200 µm. The minimum height of the pins 31 is given by the maximum unevenness of the surfaces of the power electronic component and the cooling plate 2, whereas the maximum height of the pins 31 is defined by thermal resistance of the solder joint. The pins 31 may have any appropriate cross section like a quadrangular cross section, in particular a square or a rectangular cross section or a round cross section, in particular a circular or an oval cross section. The cross section can be chosen for reasons of easy manufacturing or for geometrical reasons in the final electronic device.

Figures 2, 3:
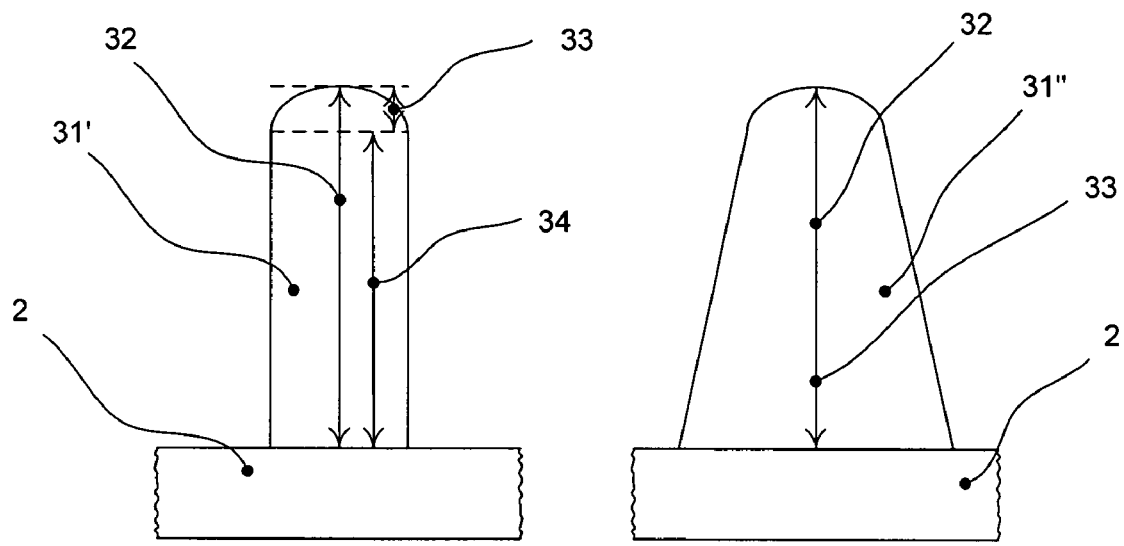
FIG. 2 shows a cross sectional view on a detail of another exemplary embodiment of the base plate for a heat sink according to the disclosure.
FIG. 3 shows a cross sectional view on a detail of another exemplary embodiment of the base plate for a heat sink according to the disclosure.

In FIG. 2 a detail, in particular a pin 31', of another exemplary embodiment of the base plate 1 is shown. The cross section of the pin 31' diminishes with the distance from the surface of the cooling plate 2 at least in the top area of the pins 31'. The diminution of the cross section can be limited to the top area of the pins 31' in a length region 33 between 90% and 100% of the height 32 of each pin 31', leaving the pin 31' in a length region 34 between the surface of the cooling plate 2 and 90% of the height 32 of the pin 31' with a constant cross section. In another exemplary embodiment, the diminution in the cross section of the pins 31' is limited to the top area of the pins 31' in the length region 33 of 75% to 100% of the height 32 of each pin 31', in particular in a length region 33 of 50% to 100% of the height 32 of each pin 31', and in particular over the whole height 32 of each pin 31', as shown for a pin 31" in FIG. 3. In another exemplary embodiment, the cross section diminishes continuously. The advantage of such pins 31' or 31" with a decreasing cross section with the distance from the surface of the cooling plate 2 is that thermal stress due to different thermal extension in the transition area between insulating plate 8, the pin 31', 31" and the solder layer is avoided or at least reduced.

Figure 4:
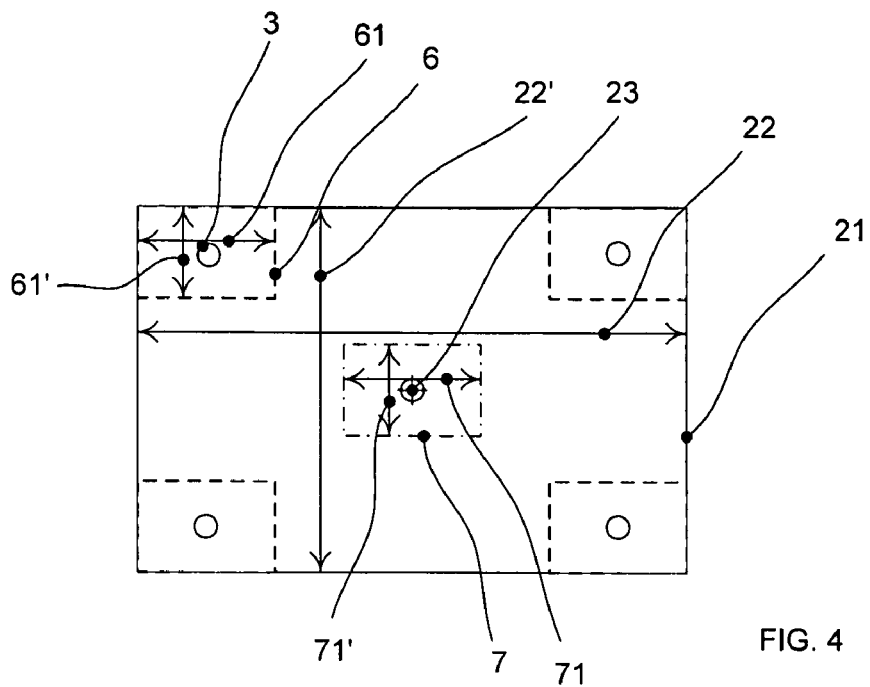
FIG. 4 shows a top view on another exemplary embodiment of the base plate for a heat sink according to the disclosure.

In FIG. 4 a top view on a base plate 1 is shown. The cooling plate 2 is in form of a first rectangular 21 and the pins 31 are arranged in the four corners of the cooling plate 2. In particular, the pins 31 are arranged within an area corresponding to a second rectangular 6 with a side length 61, 61' corresponding to a quart of the parallel lying side length 22, 22' of the cooling plate 2. The side length 61 of the second rectangular lies parallel to the side length 22 of the first rectangular, and the side length 61' parallel to the side length 61'. The second rectangular 6 extends on the surface of the cooling plate 2 from a corner of the cooling plate 2. The area in which the pins 31 are arranged should be chosen in such a way that no heat producing part of the electronic component is arranged directly above the pins 31', thereby avoiding a reduction of heat transfer capability in the region of the pins 31.

Another exemplary embodiment of the base plate 1 is also shown in FIG. 4. A pin 31 is arranged around the centre in the middle part of the cooling plate 2, in particular within an area around the centre of the cooling plate 2, the area corresponding to a third rectangular 7 with a side length 71, 71' corresponding to a quart of the parallel lying side length 22, 22' of the cooling plate 2. In another exemplary embodiment, the pin 31 is arranged in the centre 23 of the first rectangular 21. Of course, the cooling plate 2 can have other forms than a first rectangular 21, and in an exemplary embodiment, not shown in a figure, pins 31 are arranged in the corners of the cooling plate 2 or outer areas, which border on the edge of the cooling plate 2.

Figure 6:
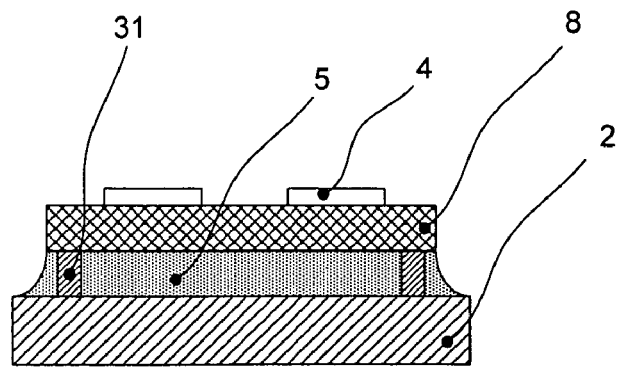
FIG. 6 shows a cross sectional view on an exemplary semiconductor module.

In FIG. 6 an exemplary electronic device in form of a semiconductor module is shown, which comprises at least one power electronic component in form of a semiconductor chip 4 and an exemplary base plate 1. The semiconductor chips 4 can be insulated gate bipolar transistors (IGBT).

The at least one semiconductor chip 4 is bonded by a metallurgical process, e.g., by soldering or metal bonding, on an electrically insulating plate 8, which is typically a ceramic substrate. The insulating plate 8 is plate is bonded by a metallurgical process, in particular by soldering, on the side, which lies opposite the side, on which the at least one semiconductor chip 4 is arranged, on the base plate 1. Also low temperature bonding can be used as a metallurgical bonding for one or both bondings. Such low temperature bondings are typically made under high pressure and temperatures typically below 300° C. Metals like silver and indium or tin and gold are used for making the joint. The metals are applied on the surfaces to be jointed together as thin sheets and/or as a powder. Such low-temperature bonding methods are for example described in PCT/CH2006/00610.

These metallurgical bondings are non-detachable connections, i.e. the connections are destroyed if trying to separate the two elements bonded together under normal conditions.

Figure 5:
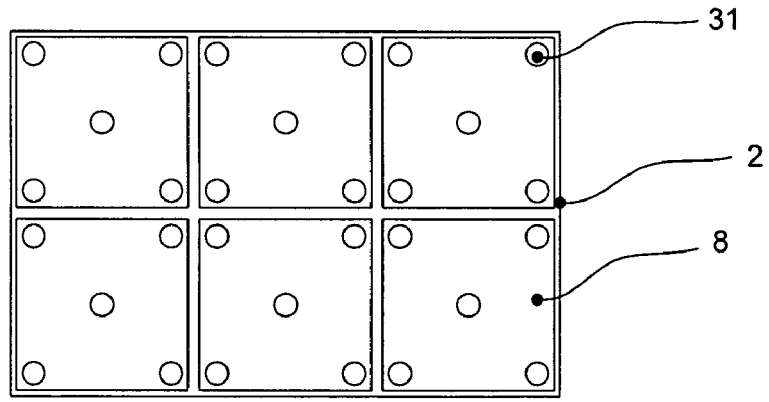
FIG. 5 shows a top view on another exemplary embodiment of the base plate for a heat sink according to the disclosure.

In another exemplary embodiment, shown in FIG. 5, a plurality of such insulating plates 8 (in this case: six), each with at least one semiconductor chip 4 arranged on one side, are arranged together on one base plate 1. At least four pins 31 are arranged on the base plate 1 for a contact with each insulating plate 8. In an exemplary embodiment, the insulating plate(s) 8 is rectangular and these pins 31 are arranged on the base plate 1 such that they can make contact to the four corners of each insulating plate 8. More generally, the pins 31 are arranged outside the projected area, in which the at least one semiconductor chip 4 is arranged. A further pin 31 may be arranged in the middle part, in particular in the centre of each insulating plate 8. Any other number of insulating plates, i.e. one or more, are arrangeable on the base plate 1, each with pins 31 arranged in such a way that the pins 31 can make contact to the corners of each insulating plate 8 in the described manner.

In another exemplary embodiment, not shown in a figure, the exemplary base plate 1 is thermally and electrically conductive connected to the at least one semiconductor chip 4.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1 Base plate
2 Cooling plate

21 First rectangular
22, 22' Side length
23 Centre
3 Spacer element
31, 31', 31" Pins
32 Height
33 Length region
34 Length region
4 Semiconductor chip
5 Solder layer
6 Second rectangular
61, 61' Side length
7 Third rectangular
71, 71' Side length
8 insulating plate

What is claimed is:

1. An electronic device comprising:
at least one power electronic component,
an electrically insulating plate, and
a base plate with a cooling plate,
wherein the base plate comprises spacer elements, which are arranged on the surface of the cooling plate between the electrically insulating plate and the cooling plate, the spacer elements and the cooling plate being made as one piece and the material in the surface region of the cooling plate and of the spacer elements being the same,
wherein the cooling plate comprises a metal matrix composite,
wherein the at least one power electronic component is bonded by a metallurgical process, on the electrically insulating plate, and the electrically insulating plate is bonded by a metallurgical process, on the base plate, and
wherein the spacer elements extend from the surface of the cooling plate to a height between 50 to 200 μm.

2. The electronic device according to claim 1, wherein the spacer elements are pins.

3. The electronic device according to claim 2, wherein the pins have a cross section of less than 2 mm×2 mm, in particular 1 mm×1 mm.

4. The electronic device according to claim 2, wherein the pins have a round cross section, in particular a circular or an oval cross section.

5. The electronic device according to claim 2, wherein the pins have a quadrangular cross section, in particular a square or a rectangular cross section.

6. The electronic device according to claim 2, wherein a cross section of the pins diminishes with increased distance from the surface of the cooling plate at least in a top area of the pins and in a length region between 90 and 100% of a height of each pin, a length region of 75 to 100% of the height of each pin, a length region of 50 to 100% of the height of each pin, or a length over an entire height of each pin.

7. The electronic device according to claim 2, wherein the cooling plate is a first rectangular and the pins arranged in each corner of the cooling plate are within an area corresponding to a second rectangular, which second rectangular extends on the surface region of the cooling plate from a respective corner of the cooling plate with a side length corresponding to a quarter of a side length of the cooling plate, which side of the cooling plate lies parallel to a side of the second rectangular.

8. The electronic device according to claim 7, wherein another pin is arranged in a middle part of the first rectangular, and within an area around a center corresponding to a third rectangular with a side length corresponding to a quarter of the side length of the cooling plate, which side of the cooling plate lies parallel to a side of the third rectangular, and in a center of the first rectangular.

9. The electronic device according to claim 2, wherein the base plate is metallurgically bonded to at least one insulating plate, each with the at least one power electronic component arranged on a side opposite the base plate, and at least four pins are provided for a contact with each insulating plate.

10. The electronic device according to claim 9, wherein the at least four pins for contacting each insulating plate are arranged such that the at least four pins are arranged outside an area, in which the at least one power electronic component is arranged, and the at least one insulating plate is rectangular and the at least four pins are arranged in the corners of each insulating plate.

11. The electronic device according to claim 10, wherein a further pin is arranged in a middle point of each insulating plate.

12. The electronic device according to claim 2, wherein the pins are arranged in a geometrical periodical structure.

13. The electronic device according to claim 1, in which the electronic device is a semiconductor module and the at least one power electronic component is at least one insulated gate bipolar transistor.

14. The electronic device according to claim 13, wherein at least two insulating plates are metallurgical bonded on the base plate.

15. The electronic device according to claim 3, wherein the pins extend from the surface of the cooling plate to a height between 50 to 200 μm.

16. The electronic device according to claim 3, wherein the pins have a round cross section as one of a circular or an oval cross section.

17. The electronic device according to claim 3, wherein the pins have a quadrangular cross section as one of a square or a rectangular cross section.

18. The electronic device according to claim 4, wherein the cross section of the pins diminishes with increased distance from the surface of the cooling plate at least in a top area of the pins, in a length region between 90 and 100% of a height of each pin, in a length region of 75 to 100% of the height of each pin, in a length region of 50 to 100% of the height of each pin, or over an entire height of each pin.

19. The electronic device according to claim 6, wherein the cooling plate is a first rectangular and the pins arranged each corner of the cooling plate and within an area corresponding to a second rectangular, which second rectangular extends on the surface of the cooling plate from a corner of the cooling plate with a side length corresponding to a quarter of the side length of the cooling plate, which side of the cooling plate lies parallel to the side of the second rectangular.

20. The electronic device according to claim 6, wherein the base plate is metallurgically bonded to at least one insulating plate, each with the at least one power electronic component arranged on a side opposite the base plate, and in that at least four pins are provided for a contact with each insulating plate.

21. The electronic device according to claim 12, in which the electronic device is a semiconductor module and the at least one power electronic component is at least one insulated gate bipolar transistor.

22. The electronic device according to claim 1, wherein the metal matrix composite is a silicon-carbide preform infiltrated with molten aluminum.

* * * * *